(12) United States Patent
Thio et al.

(10) Patent No.: US 6,689,666 B1
(45) Date of Patent: Feb. 10, 2004

(54) REPLACING A FIRST LINER LAYER WITH A THICKER OXIDE LAYER WHEN FORMING A SEMICONDUCTOR DEVICE

(75) Inventors: Hsiao-Han Thio, Sunnyvale, CA (US); Nian Yang, San Jose, CA (US); Zhigang Wang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 34 days.

(21) Appl. No.: 10/126,841

(22) Filed: Apr. 19, 2002

(51) Int. Cl.[7] ............................................. H01L 21/336
(52) U.S. Cl. ....................................... 438/303; 438/294
(58) Field of Search .................................. 438/294–307

(56) References Cited

U.S. PATENT DOCUMENTS 6,521,519 B2 * 2/2003 Shimizu et al. ............. 438/595

* cited by examiner

Primary Examiner—Jey Tsai (57) ABSTRACT

A method (300) of fabricating a semiconductor device. An oxide layer (220) is produced on a sidewall (211) of a stacked gate (210) and over a shallow trench (212) adjacent to the stacked gate. The thickness of the oxide layer is sufficient to withstand a subsequent etch. A first layer (222) of material is deposited over the oxide layer. In a first etch, the first layer is reduced to a first thickness along the sidewall. Because the oxide layer has a depth sufficient to withstand the first etch, the oxide layer serves as a protective layer for the shallow trench during the first etch. Accordingly, a protective liner layer does not need to be deposited in addition to the oxide layer.

20 Claims, 13 Drawing Sheets

REPLACING A FIRST LINER LAYER WITH A THICKER OXIDE LAYER WHEN FORMING A SEMICONDUCTOR DEVICE

TECHNICAL FIELD

The present claimed invention generally relates to semiconductors. More specifically, the present claimed invention relates to a method of forming a semiconductor device.

BACKGROUND ART

Various techniques known in the art can be used to fabricate a semiconductor device such as an integrated circuit or processor. In general, these techniques typically involve applying a layer of material to an underlying substrate or over a preceding layer, and then selectively removing the material using an etch process. Using these techniques, the components of a semiconductor device, perhaps comprising different types of material, can be accurately formed and placed.

One type of component used by semiconductor devices is an isolation device. An isolation device, in general, includes a stacked gate isolated from an adjacent stacked gate by a shallow trench. The isolation device also typically includes a spacer formed on the sidewalls of the stacked gate.

Prior Art FIGS. 1A through 1F illustrate a prior art process for forming spacers in an isolation device. For simplicity of discussion, the process is described for a single spacer 50 (FIG. 1F) formed on the sidewall 11 of a stacked gate 10 adjacent to a shallow trench 12. Shallow trench 12 is filled with a material such as high density plasma (HDP) oxide.

Figure 1A:
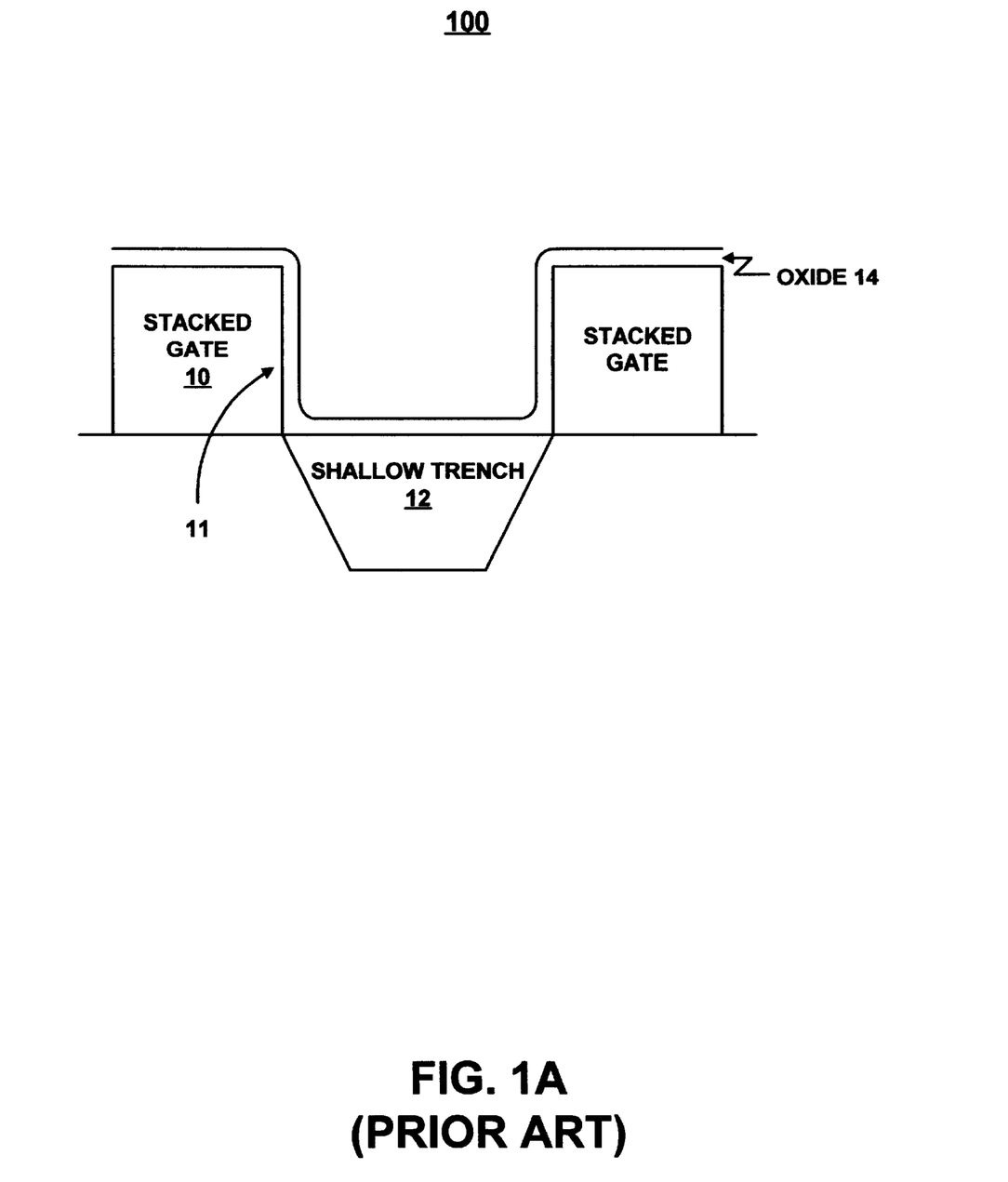
FIGS. 1A, 1B, 1C, 1D, 1E and 1F illustrate a process for forming a spacer in a semiconductor device according to the prior art.

Referring first to FIG. 1A, a residual oxide layer 14 (e.g., silicon dioxide, $SiO_2$) is formed over stacked gate 10 (including sidewall 11) and shallow trench 12. The residual oxide layer 14 is formed during annealing of the silicon. Usually, the residual oxide layer 14 includes a pre-implant oxide layer and a layer of oxide grown by a gate anti-reflective coating (GARC) anneal. Typically, the pre-implant oxide layer is approximately 50 to 75 Angstroms (Å) in thickness, and the oxide layer grown by the GARC anneal is approximately 95 Å in thickness. However, the total thickness of the residual oxide layer 14 is actually something less than the sum of the thicknesses of the pre-implant oxide layer and the oxide layer grown by the GARC anneal. A typical residual oxide layer 14 is approximately 100 Å in depth, although it may be less.

Figure 1B:
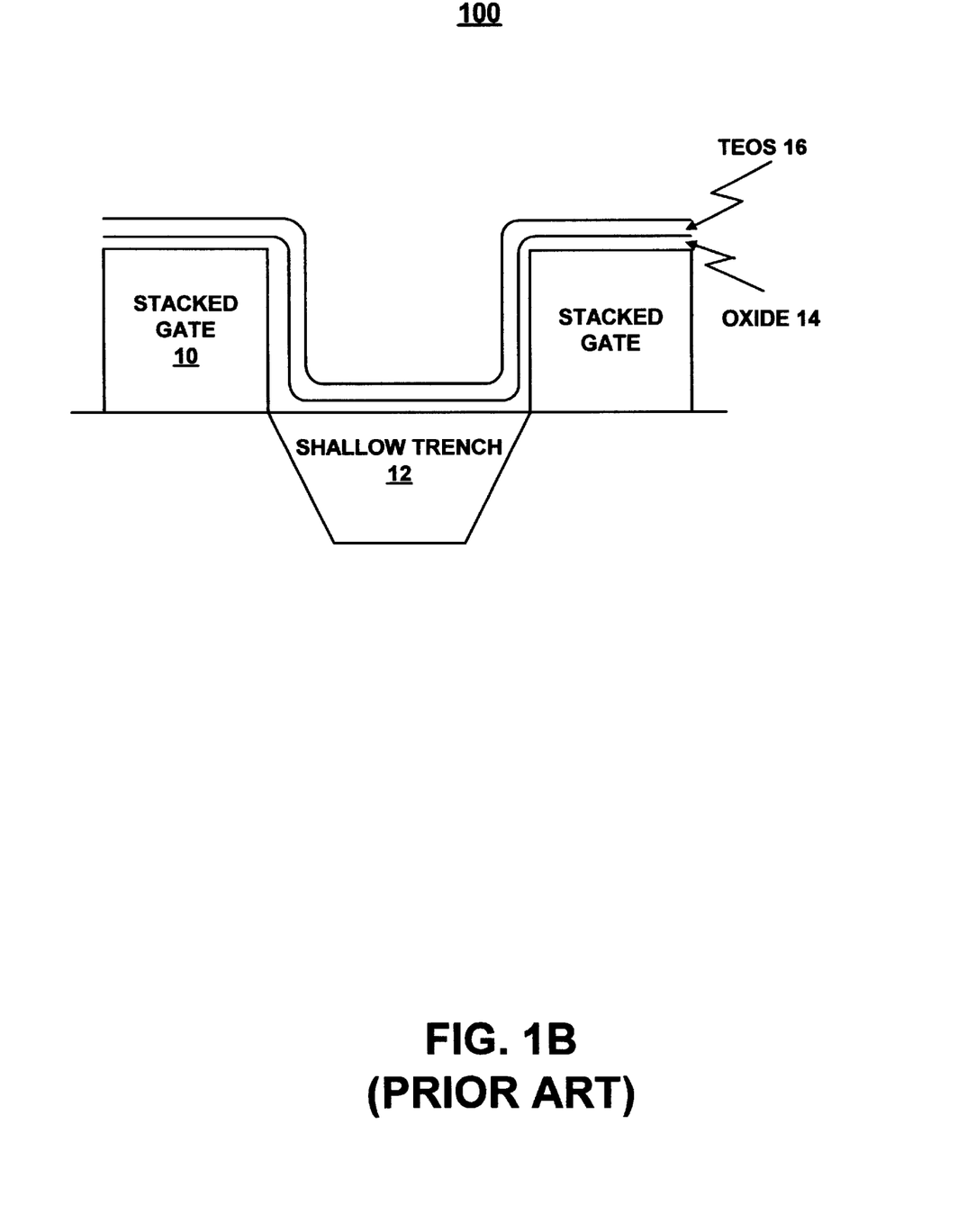

With reference to FIG. 1B, a liner layer 16 of a first material, typically TEOS (tetraethylorthosilicate), is deposited over stacked gate 10 (including sidewall 11) and shallow trench 12. Liner layer 16 typically has a thickness of approximately 150 Å.

Figure 1C:
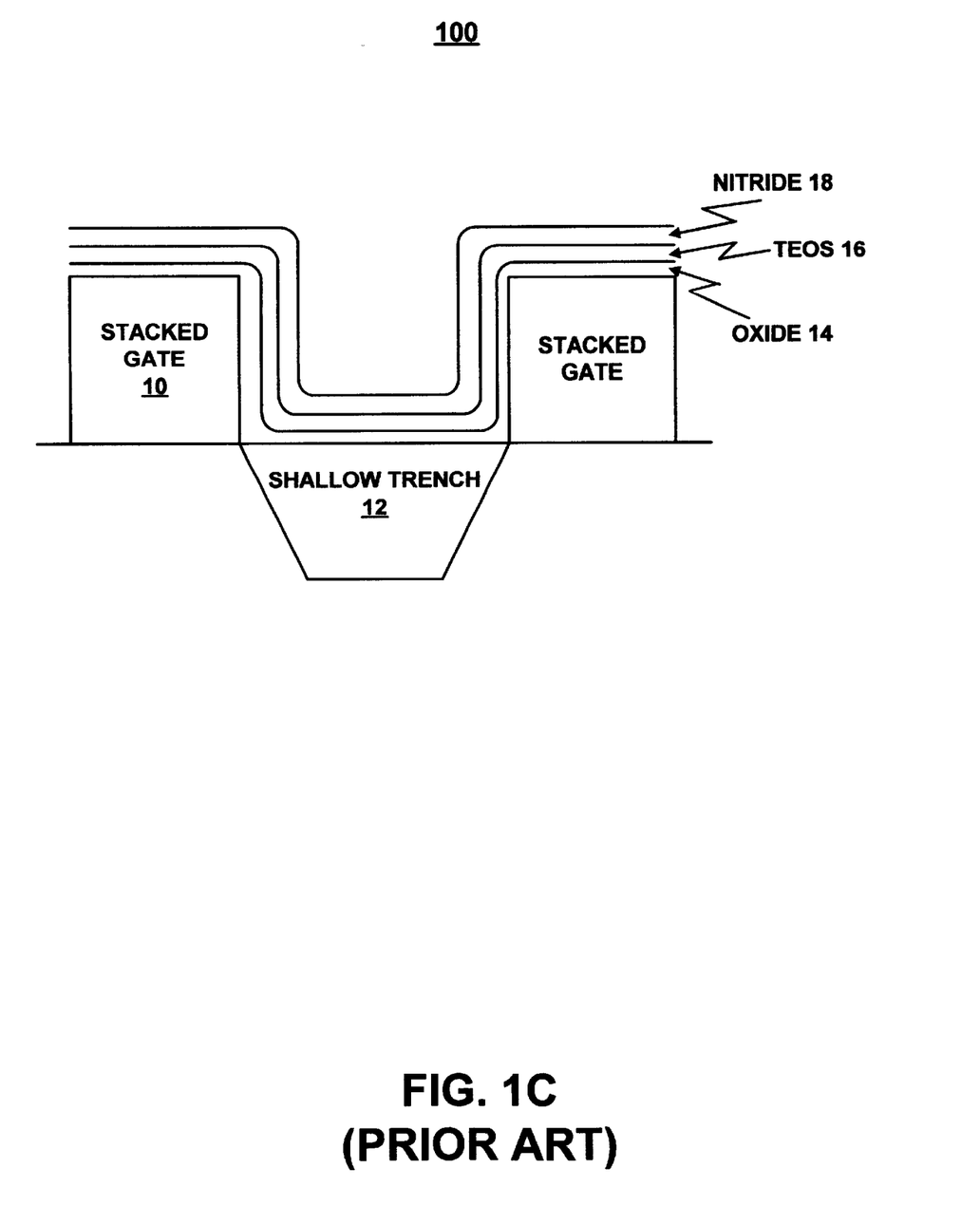
Figure 1D:
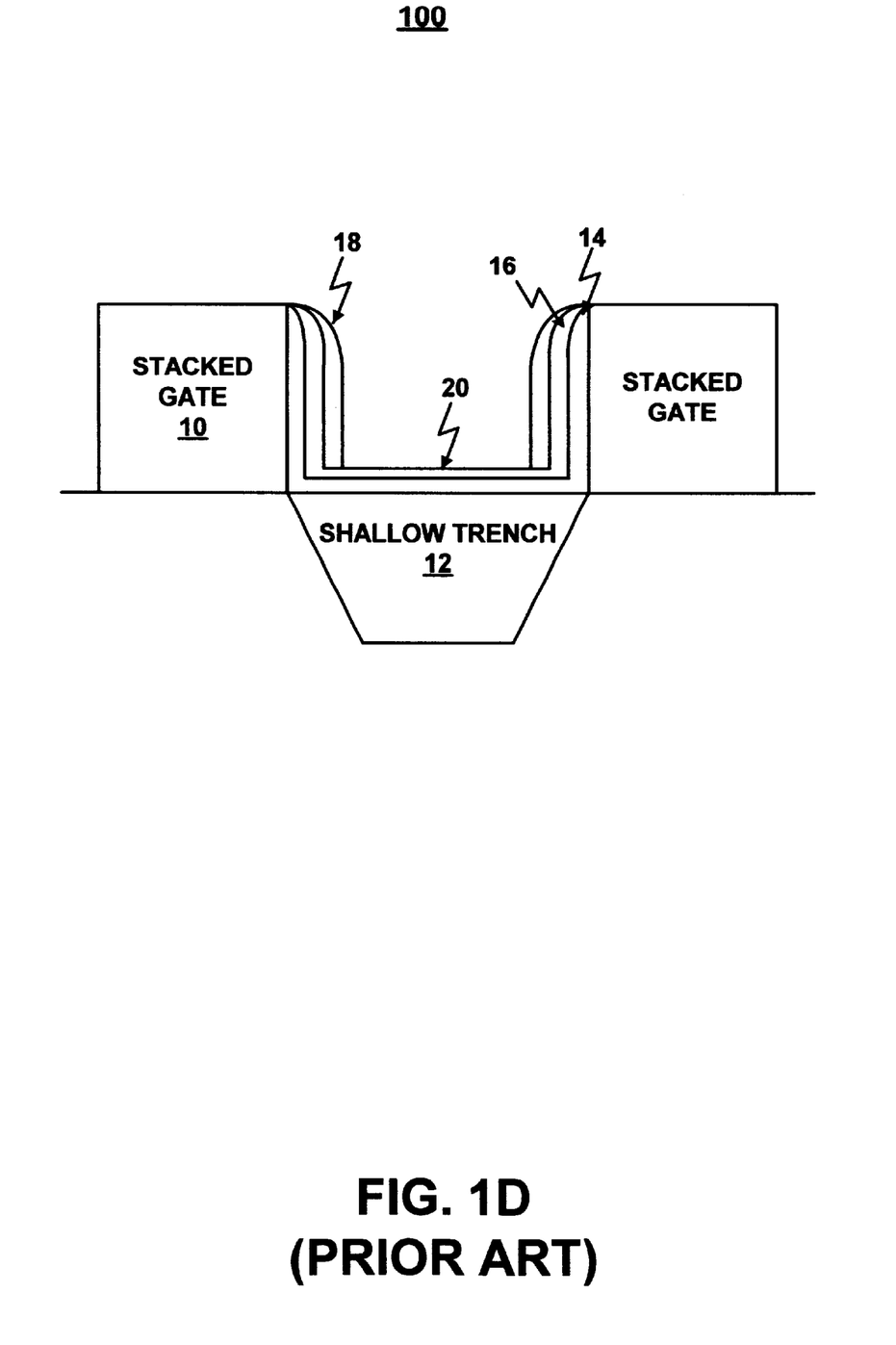

Next referring to FIG. 1C, a layer 18 of a second material, typically nitride, is deposited over the liner layer 16. Referring now to FIG. 1D, an etch of layers 16 and 18 is performed, removing the nitride and essentially all of the TEOS from the horizontal surfaces of the isolation device; however, a thin layer of TEOS typically remains on the surface 20 over shallow trench 12. Also, a layer 16 of TEOS and a layer 18 of nitride also remain on the sidewall of stacked gate 10. The residual oxide layer 14, underlying the other layers, also remains.

Figure 1E:
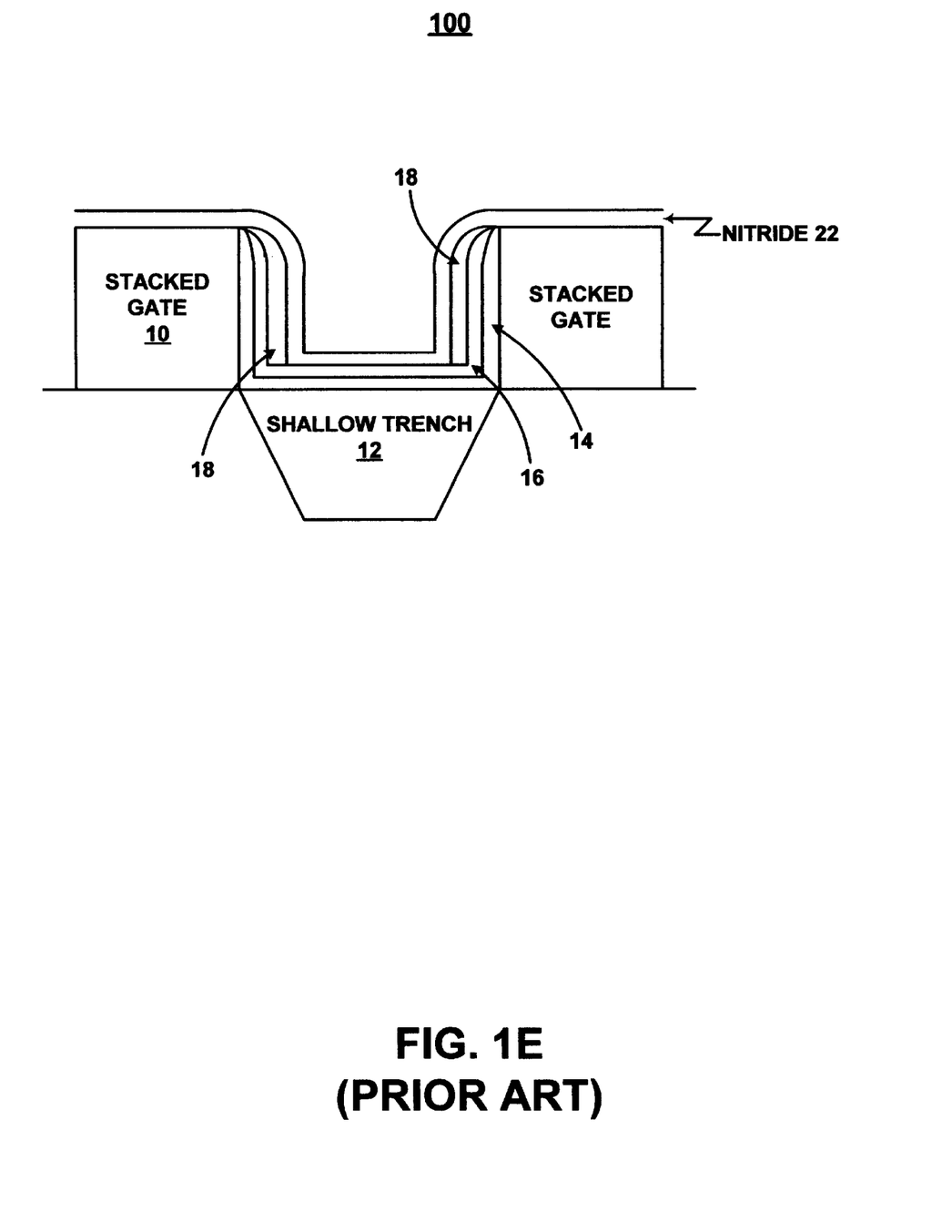
Figure 1F:
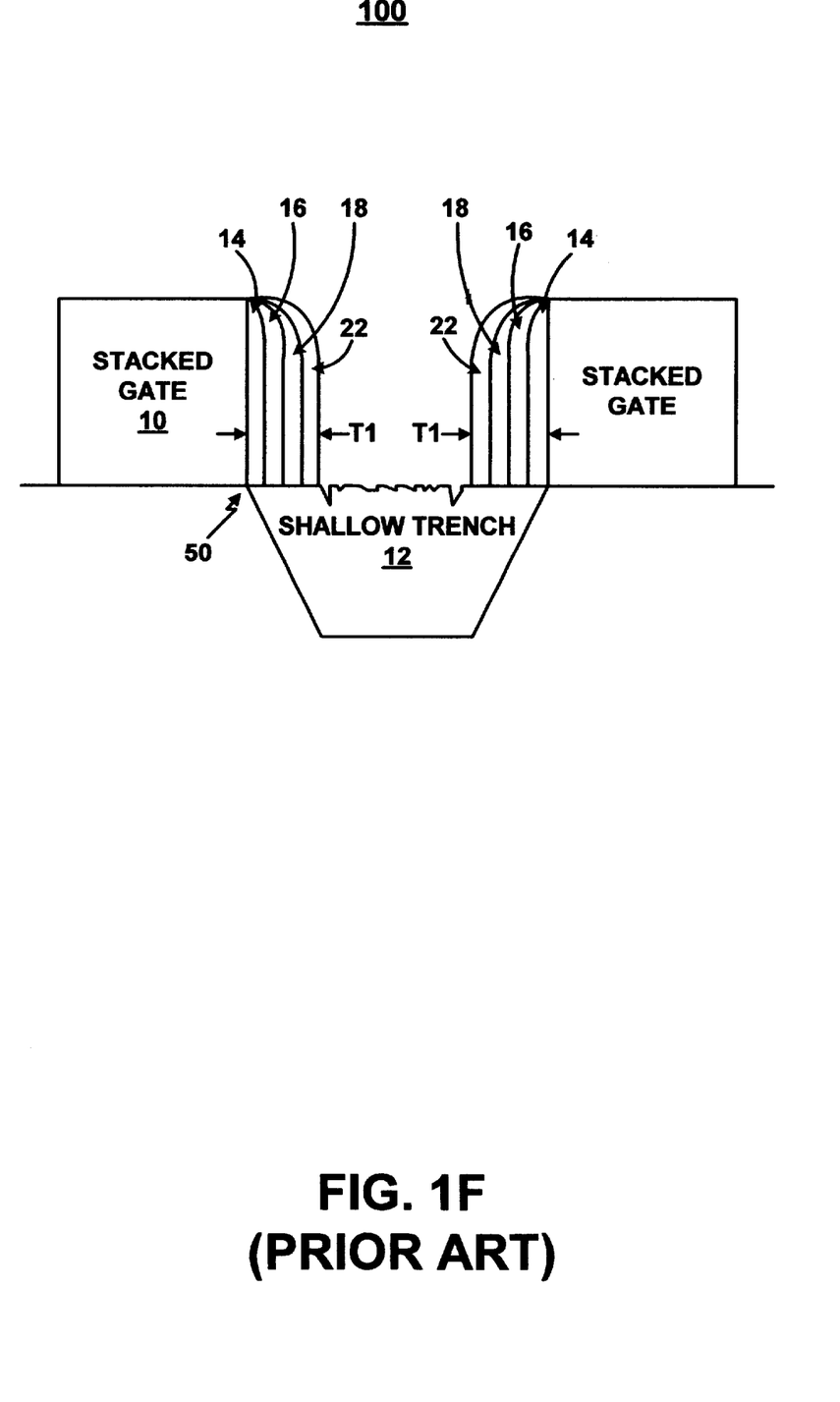

With reference to FIG. 1E, a layer 22 of material, typically nitride, is deposited over the remaining portions of layers 16 and 18. Referring now to FIG. 1F, an etch of layer 22 is performed to remove layer 22 from the horizontal surfaces of the isolation device and to form a spacer 50 having a prescribed (design) thickness T1. Spacer 50 is thus formed of layers 16, 18 and 22 using a process that includes two etches. The residual oxide layer 14, underlying the other layers, also is present along sidewall 11.

A problem with the process illustrated by FIGS. 1A through 1F is that, during the second etch, relatively significant gouging of the HDP oxide in shallow trench 12 often occurs. The liner layer 16 is reduced to a thin layer, or effectively removed, during the first etch. Any remaining portion of layer 16 is not sufficiently thick to withstand the second etch and serve as a protective layer for the shallow trench 12 for the duration of the second etch. Consequently, shallow trench 12 is exposed during the second etch, allowing the HDP oxide to be gouged by the etch.

As a result of the gouging, isolation issues may be introduced, reducing the effectiveness of the isolation device. If these isolation issues are not detected or corrected, the performance of the semiconductor device may also be affected. Detection and correction of the gouging can reduce the yield (throughput) of the fabrication process and increase the unit cost of the semiconductor device.

Accordingly, what is needed is a method and/or system that can be used to form spacers in an isolation device, but without gouging the shallow trench filler material. The present invention provides a novel solution to this need.

DISCLOSURE OF THE INVENTION

Embodiments of the present invention provide a method and system thereof that can be used to form spacers in an isolation device, but without gouging the shallow trench filler material.

In one embodiment, an oxide layer is produced on a sidewall of a stacked gate and over a shallow trench adjacent to the stacked gate. The thickness of the oxide layer is sufficient to withstand a subsequent etch. A first layer of material is deposited over the oxide layer. In a first etch, the first layer is reduced to a first thickness along the sidewall. Because the oxide layer has a depth sufficient to withstand the first etch, the oxide layer serves as a protective layer for the shallow trench during the first etch. Accordingly, a protective liner layer does not need to be deposited in addition to the oxide layer.

In one embodiment, a second layer is deposited to a second thickness over the first layer subsequent to the first etch. A third layer is deposited over the second layer. In a second etch, the third layer is reduced to a third thickness along the sidewall. During the second etch, the second layer serves as a protective layer for the shallow trench. In the present embodiment, the first, second and third layers in combination form a spacer having a thickness corresponding to the first, second and third thicknesses.

In one embodiment, the first layer comprises nitride. In one embodiment, the second layer comprises TEOS (tetraethylorthosilicate). In another embodiment, the third layer comprises nitride. In yet another embodiment, the shallow trench is substantially filled with material comprising high density plasma (HDP) oxide. In another embodiment, the oxide layer is a residual oxide layer comprising a pre-implant oxide layer and an oxide layer grown by a gate anti-reflective coating (GARC) anneal. In one embodiment, the depth of the residual oxide layer is between approximately 150 and 180 Angstroms.

In its various embodiments, the present invention protects the shallow trench (e.g., the HDP oxide filler material) from gouging during etching, particularly during the second etch.

This aspect of the present invention is especially beneficial as the length (in time) of the second etch is increased in order to remove nitride stringers at the core-periphery interface.

BRIEF DESCRIPTION OF THE DRAWINGS

The accompanying drawings, which are incorporated in and form a part of this specification, illustrate embodiments of the invention and, together with the description, serve to explain the principles of the invention.

PRIOR ART

The drawings referred to in this description should be understood as not being drawn to scale except if specifically noted.

BEST MODES FOR CARRYING OUT THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, the present invention may be practiced without these specific details. In other instances, well-known methods, procedures, components, and circuits have not been described in detail as not to unnecessarily obscure aspects of the present invention.

Some portions of the detailed descriptions that follow are presented in terms of procedures, logic blocks, processing, and other symbolic representations of operations for fabricating semiconductors. These descriptions and representations are the means used by those skilled in the art of semiconductor device fabrication to most effectively convey the substance of their work to others skilled in the art. In the present application, a procedure, logic block, process, or the like, is conceived to be a self-consistent sequence of steps or instructions leading to a desired result. The steps are those requiring physical manipulations of physical quantities. It should be borne in mind, however, that all of these and similar terms are to be associated with the appropriate physical quantities and are merely convenient labels applied to these quantities. Unless specifically stated otherwise as apparent from the following discussions, it is appreciated that throughout the present application, discussions utilizing terms such as "receiving," "etching," "producing," "depositing" or the like, refer to actions and processes (e.g., process 300 of FIG. 3) of semiconductor fabrication.

FIGS. 2A, 2B, 2C, 2D, 2E and 2F illustrate a process for forming a spacer in a semiconductor device (e.g., in an isolation device) according to one embodiment of the present invention. For simplicity of discussion and illustration, the process is described for a single spacer 250 (FIG. 2F) formed on the sidewall 211 of a stacked gate 210 adjacent to a shallow trench 212. It is appreciated that other processes and steps associated with the fabrication of a semiconductor device may be performed along with the process illustrated by FIGS. 2A through 2F. Importantly, embodiments of the present invention can be implemented in conjunction with these other (conventional) processes and steps without significantly perturbing them. Generally speaking, the various embodiments of the present invention can replace a conventional process without significantly affecting the peripheral processes and steps.

Figure 2A:
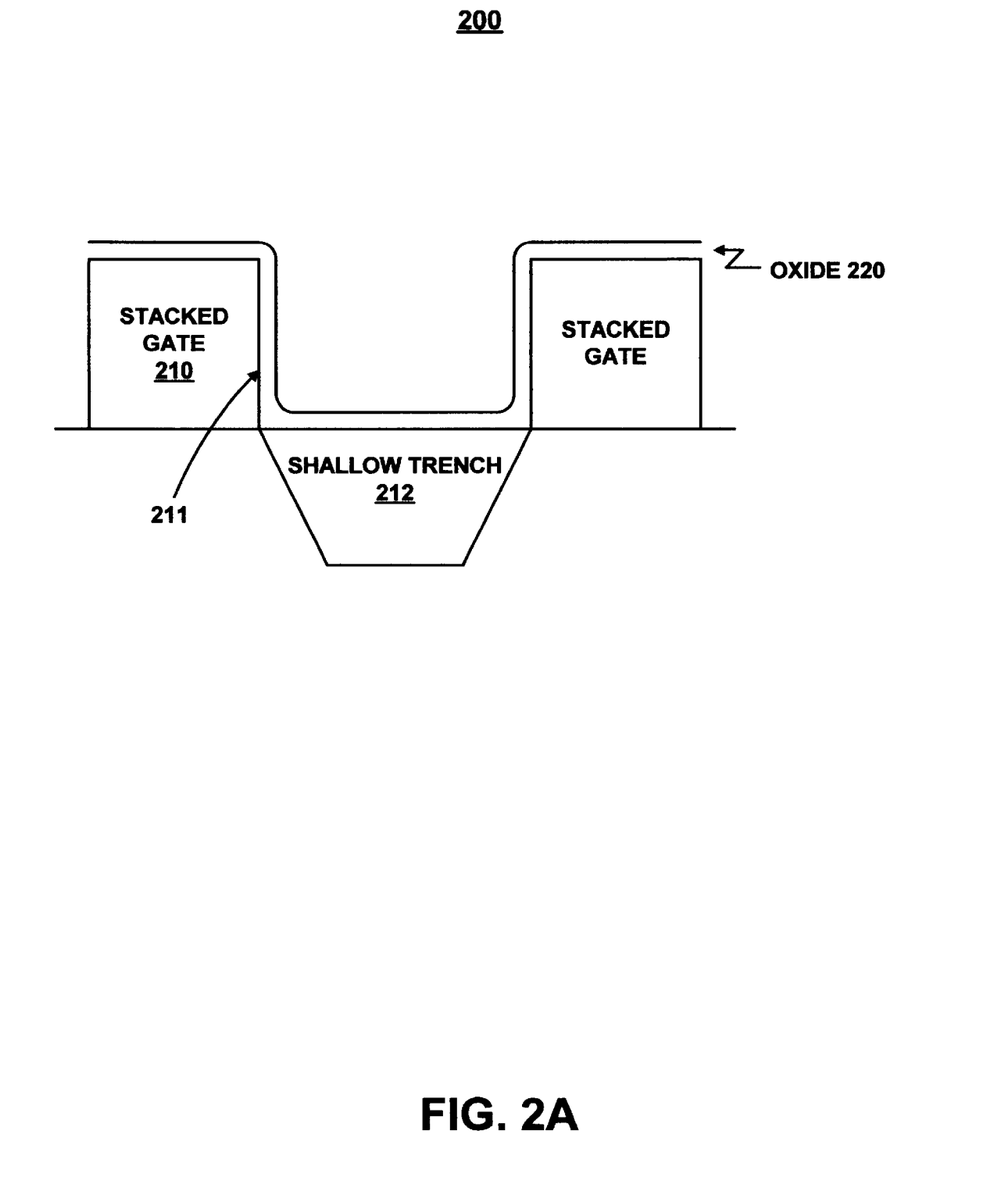
FIGS. 2A, 2B, 2C, 2D, 2E and 2F illustrate a process for forming a spacer in a semiconductor device according to one embodiment of the present invention.

Referring first to FIG. 2A, in the present embodiment, an oxide layer 220 is produced over stacked gate 210 (including sidewall 211) and shallow trench 212. In one embodiment, shallow trench 212 is substantially filled with a material that comprises high density plasma (HDP) oxide, although it is appreciated that other suitable materials may be used.

In one embodiment, oxide layer 220 comprises silicon dioxide ($SiO_2$) produced (or grown) as a result of the annealing of the underlying silicon. In one such embodiment, the oxide layer 220 includes a pre-implant oxide layer and a layer grown by a gate anti-reflective coating (GARC) anneal. In accordance with the present embodiment of the present invention, the pre-implant oxide layer is grown to a thickness of approximately 125 Angstroms (Å), while the oxide layer due to the GARC anneal is grown to approximately 95 Å in thickness. However, the total thickness of the residual oxide layer 220 is actually something less than the sum of the thicknesses of the pre-implant oxide layer and the oxide layer grown by the GARC anneal. For a pre-implant oxide layer thickness of approximately 125 Å and an oxide layer thickness due to the GARC anneal of approximately 95 Å, respectively, residual oxide layer 220 is expected to have a depth (thickness) ranging between approximately 150 and 180 Å.

Thus, in one embodiment, the pre-implant oxide layer is grown to a greater depth relative to the prior art; therefore, the residual oxide layer 220 is also deeper. Significantly, this is accomplished without extending the duration of the thermal cycle. By increasing its depth, the residual oxide layer 220 can withstand a first etch; accordingly, residual oxide layer 220 can serve as a protective layer for shallow trench 212 during that first etch. As such, an additional liner layer does not have to be deposited prior to the first etch. Instead, the deposition of a liner layer can be delayed until after the first etch, and prior to a second etch, ensuring adequate protection of the shallow trench 212 during the second etch. This is further illustrated by FIGS. 2B through 2F.

Figure 2B:
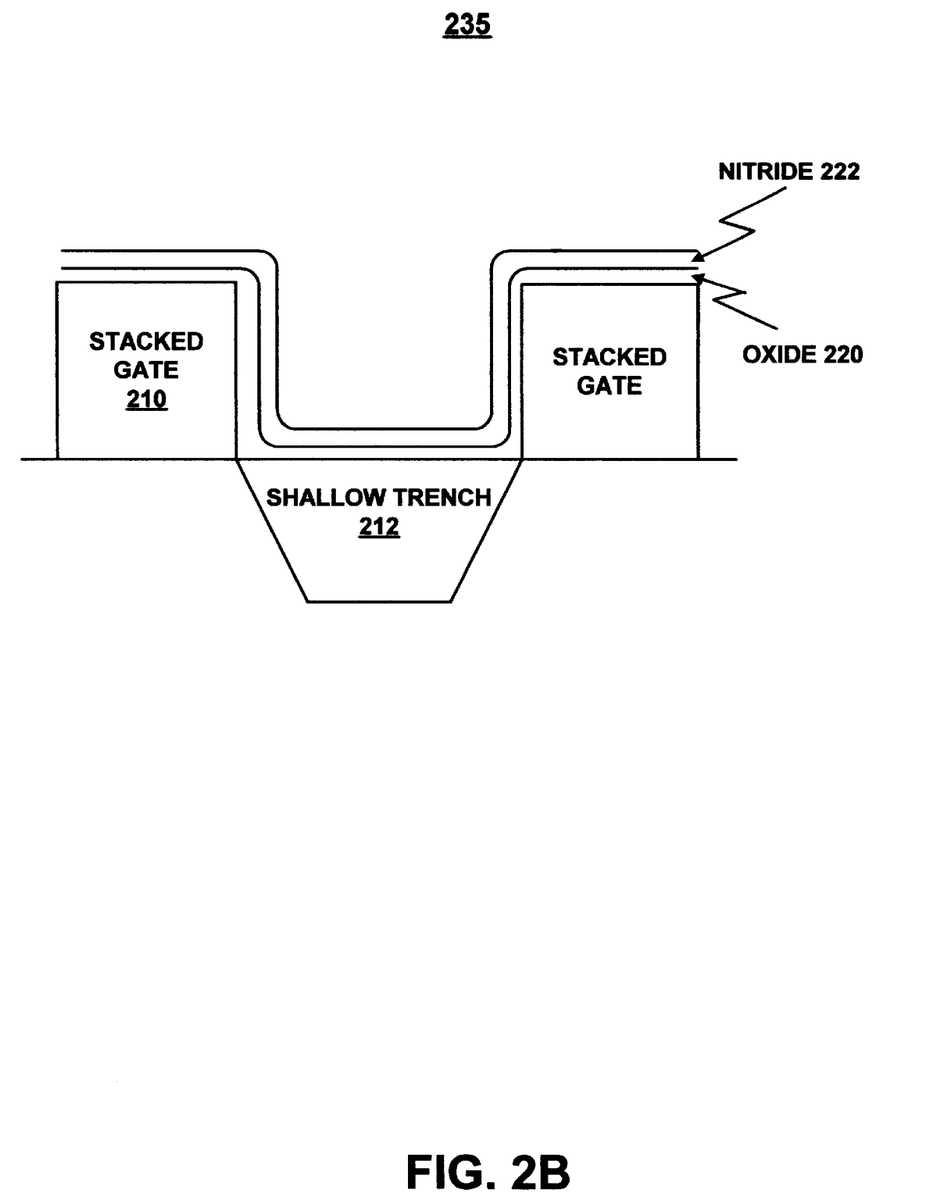

With reference to FIG. 2B, according to the present embodiment of the present invention, a layer 222 of a first material is deposited over the residual oxide layer 220. In one embodiment, layer 222 comprises nitride. It is appreciated that another suitable material may be used in accordance with the present invention. The thickness of layer 222 is selected depending on the desired (prescribed or design) thickness of the spacer to be formed. In one embodiment, the thickness of layer 222 (before etching) is approximately 325 Å.

Figure 2C:
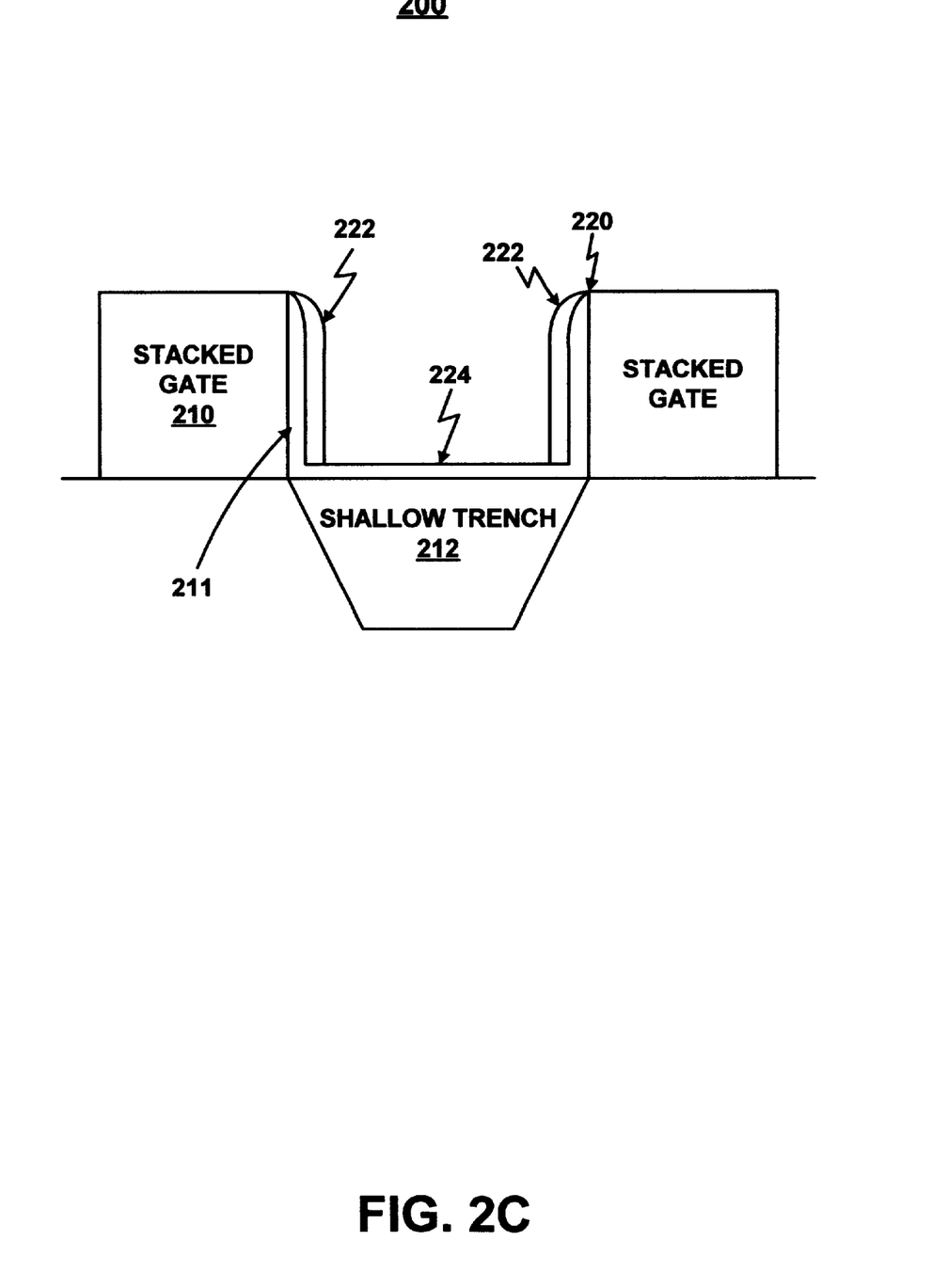

With reference to FIG. 2C, in the present embodiment, a first etch of layer 222 is performed. The first etch removes a portion of the layer 222 along the sidewall, reducing the thickness of layer 222, while entirely removing the portion of layer 222 in the horizontal region above shallow trench 212. A portion of the residual oxide layer 220 in the horizontal region above shallow trench 212 is also removed. Significantly, a relatively thin layer of residual oxide layer 220 (e.g., layer 224) remains above shallow trench 212 during and perhaps after completion of the first etch. In one embodiment, the thickness of layer 224 is approximately 50 Å. Thus, the initial thickness of the residual oxide layer 220 (specifically, the pre-implant oxide layer) is advantageously chosen to withstand the first etch, such that residual oxide layer 220 can serve as a protective layer for shallow trench 212 for the duration of the etch. Thus, gouging of the shallow trench filler material (e.g., the HDP oxide) is prevented during the first etch.

Figure 2D:
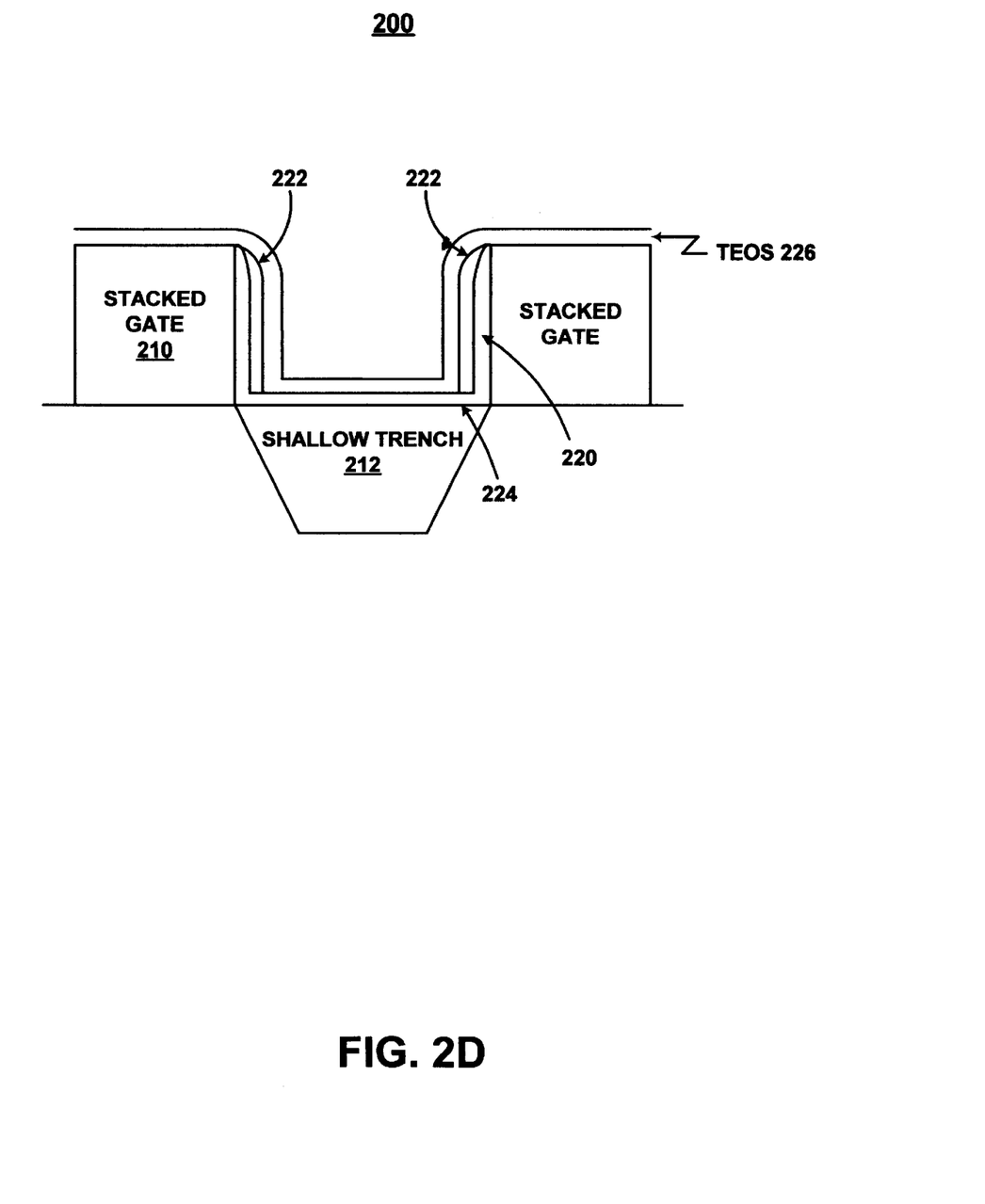

Referring next to FIG. 2D, in the present embodiment, a layer 226 of a second material is deposited over stacked gate 210 and shallow trench 212. Specifically, layer 226 is deposited over the horizontal surface of stacked gate 210, including the remaining portions of layers 220, 222 and 224. In one embodiment, layer 226 comprises TEOS (tetraethylorthosilicate), although it is appreciated that other suitable materials may be used. The thickness of layer 226 is selected depending on the prescribed (design) thickness of the spacer to be formed. In one embodiment, layer 226 has a thickness of approximately 150 Å.

Figure 2E:
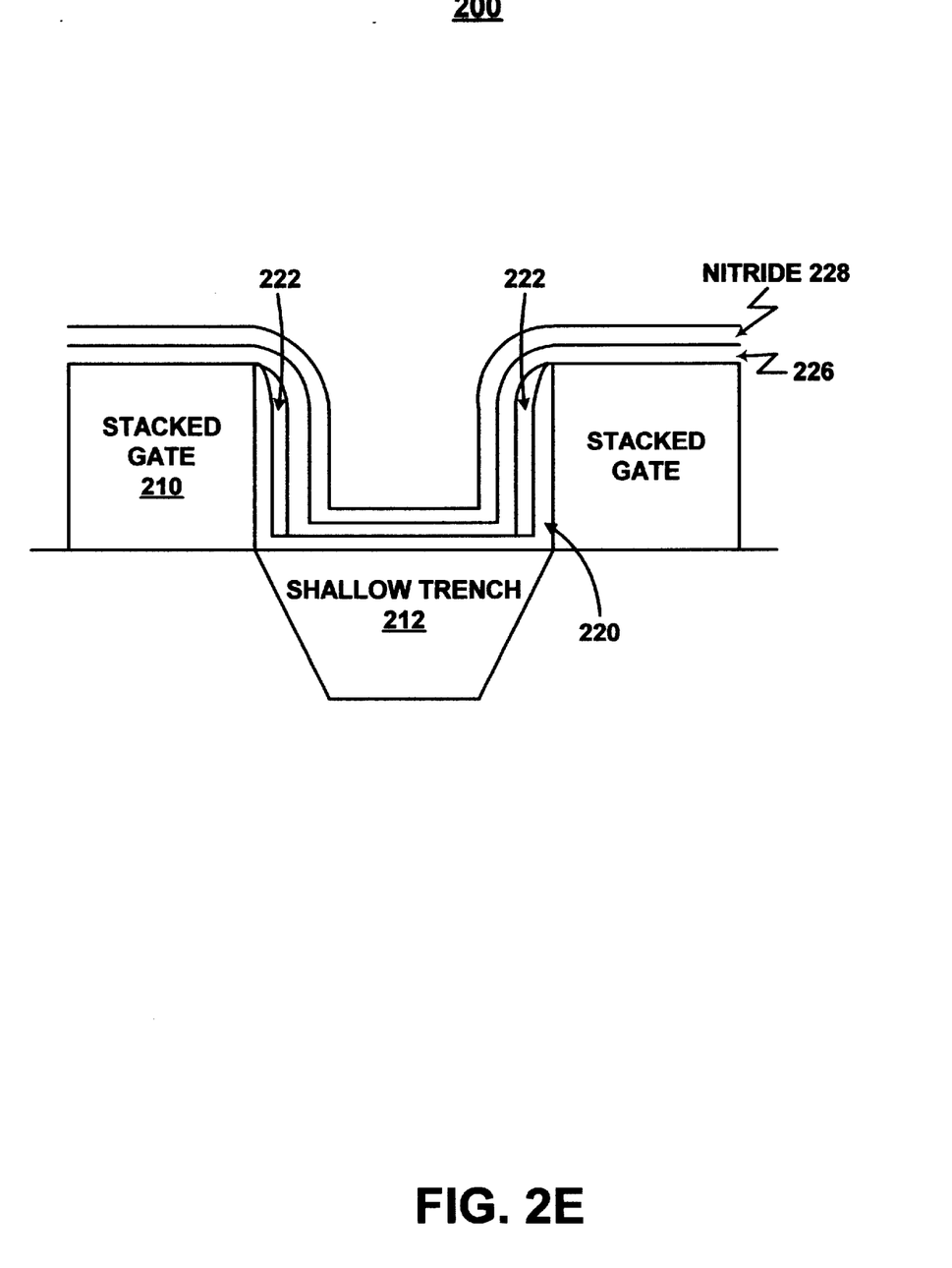

With reference now to FIG. 2E, in the present embodiment, a layer 228 of material is deposited over layer 226. In one embodiment, layer 228 comprises nitride, although it is appreciated that another suitable material may be used. The thickness of layer 228 is selected depending on the prescribed (design) thickness of the spacer to be formed. In one embodiment, layer 228 has a thickness of approximately 625 Å.

Figure 2F:
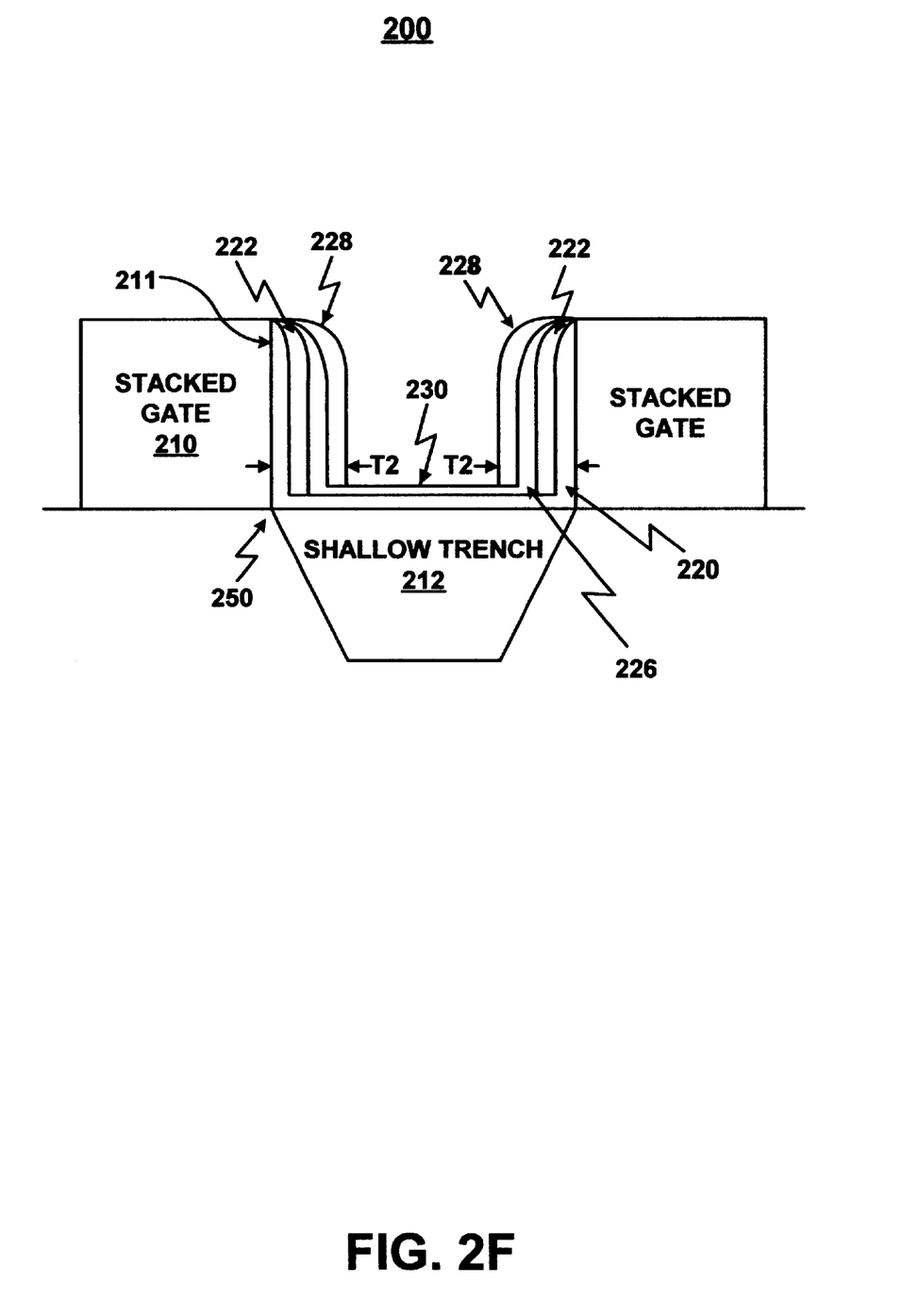

Referring now to FIG. 2F, according to the present embodiment of the present invention, a second etch is performed to form a spacer 250 of the prescribed (design) thickness T2. The second etch reduces the thickness of layer 228 along the sidewall 211, while entirely removing layer 228 in the horizontal region above shallow trench 212. In the present embodiment, along the sidewall 211 of stacked gate 210, the thickness of layer 226 is unchanged where it underlies layer 228, while the second etch removes a portion of layer 226 in the horizontal region above shallow trench 212.

Significantly, a relatively thin layer of layer 226 (e.g., layer 230) remains above shallow trench 212 during and perhaps after the second etch, although the entire thickness of layer 228 above shallow trench 212 is etched away. That is, the initial thickness of layer 226 was chosen to withstand the second etch and thus layer 226 can serve as a protective layer for shallow trench 212 for the duration of the second etch. As a result, gouging of the shallow trench filler material (e.g., the HDP oxide) is prevented during the second etch.

Also of significance, the initial thicknesses of layers 222, 226 and 228 are selected to achieve the prescribed (design) thickness T2 of spacer 250, such that the thickness of layer 226, in combination with the remaining (reduced) thicknesses of layers 222 and 228, form a spacer 250 having a thickness T2.

To summarize, in one embodiment, a thicker pre-implant oxide layer is grown, resulting in a thicker residual oxide layer. The residual oxide layer serves as a protective layer for an underlying shallow trench during a first etch, and thus a separate liner layer (e.g., a TEOS layer) does not need to be deposited prior to the first etch. Instead, deposition of the liner layer is moved to just before a second etch, where it serves as a protective layer for the underlying shallow trench during the second etch. Thus, gouging of the shallow trench filler material is prevented. In particular, the introduction of the liner layer prior to the second etch allows the second etch to proceed for a longer period of time without gouging of the shallow trench filler material. This is of increasing importance as over-etching may be needed to remove nitride stringers.

Figure 3:
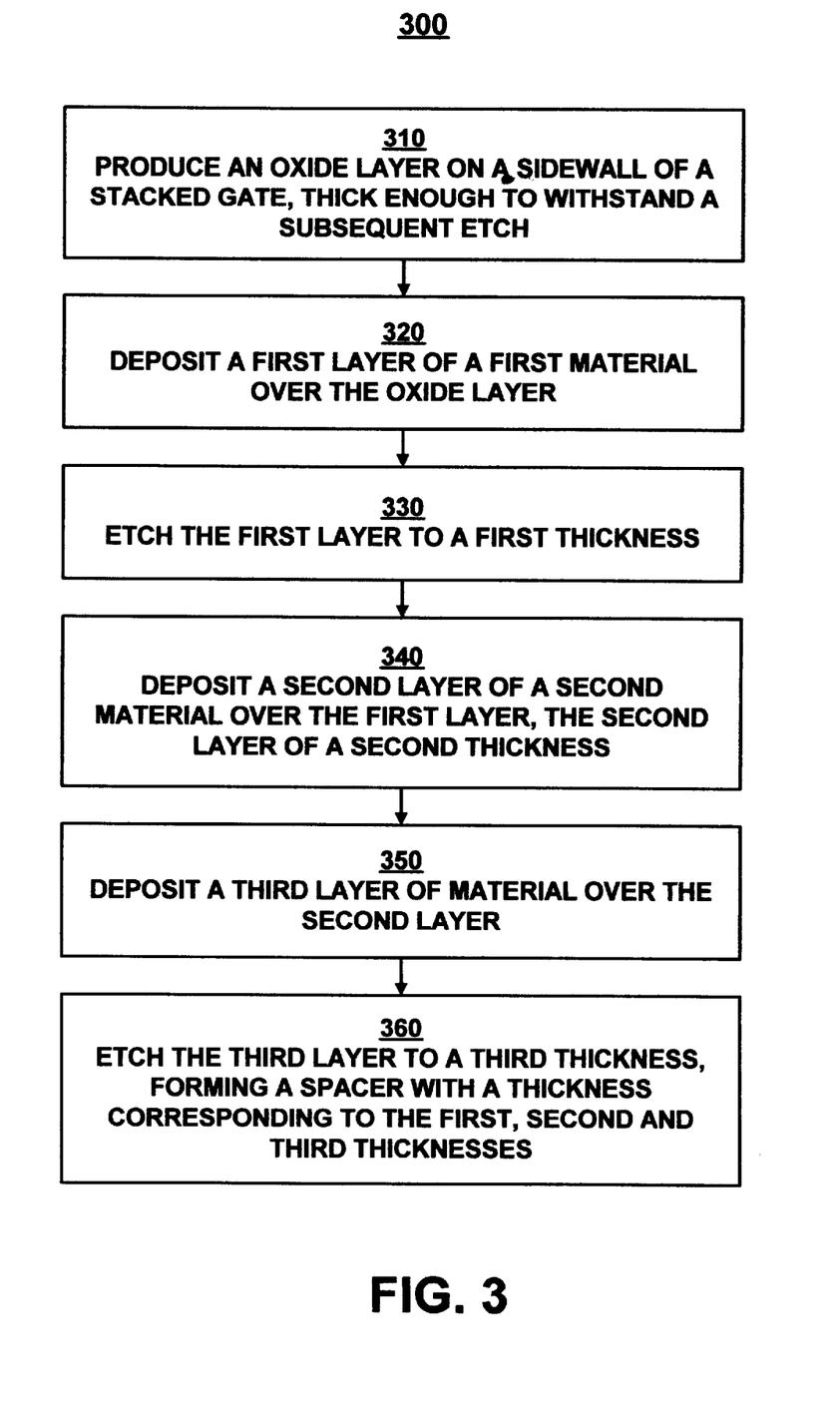
FIG. 3 is a flowchart of a process for forming a spacer in a semiconductor according to one embodiment of the present invention.

FIG. 3 is a flowchart of a process for forming a spacer in a semiconductor according to one embodiment of the present invention. Although specific steps are disclosed in flowchart 300, such steps are exemplary. That is, the present invention is well suited to performing various other steps or variations of the steps recited in flowchart 300.

In step 310, in the present embodiment, a residual oxide layer is produced on a sidewall of a stacked gate and over a shallow trench adjacent to the stacked gate. The thickness of the residual oxide layer is sufficient to withstand a subsequent etch. In one embodiment, the residual oxide layer comprises a pre-implant oxide layer and a layer grown by a GARC anneal. In one such embodiment, the pre-implant oxide layer has a depth of approximately 125 Å, and the oxide layer grown by the GARC anneal has a depth of approximately 95 Å. In another embodiment, the total depth of the residual oxide layer is between approximately 150 and 180 Angstroms.

In step 320, in the present embodiment, a first layer of material is deposited over the residual oxide layer. In one embodiment, the first layer comprises nitride.

In step 330, in the present embodiment, a first etch reduces the first layer to a first thickness along the sidewall. Because the oxide layer (step 310) has a depth sufficient to withstand the first etch, the oxide layer serves as a protective layer for the shallow trench during the first etch. Accordingly, a protective liner layer does not need to be deposited in addition to the oxide layer.

In step 340, in one embodiment, a second layer is deposited to a second thickness over the first layer subsequent to the first etch. In one embodiment, the second layer comprises TEOS (tetraethylorthosilicate).

In step 350, in one embodiment, a third layer is deposited over the second layer. In one such embodiment, the third layer comprises nitride.

In step 360, in one embodiment, a second etch reduces the third layer to a third thickness along the sidewall During the second etch, the second layer serves as a protective layer for the shallow trench. In the present embodiment, the first, second and third layers in combination form a spacer having a thickness corresponding to the first, second and third thicknesses. That is, the thickness of the spacer is approximately equal to the sum of the initial thickness of the second layer and the reduced thicknesses of the first and third layers.

Thus, embodiments of the present invention provide a method and system thereof that can be used to form spacers in an isolation device, but without gouging the shallow trench.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method of fabricating a semiconductor device, said method comprising:

producing an oxide layer on a sidewall of a stacked gate and over a shallow trench adjacent to said stacked gate;

depositing a first layer over said oxide layer; and etching in a first etch said first layer, said first layer reduced by said first etch to a first thickness along said sidewall;

wherein said oxide layer has a depth sufficient to withstand said first etch such that said oxide layer serves as a protective layer for said shallow trench during said first etch, said oxide layer serving as said protective layer in lieu of a liner layer.

2. The method of claim 1 comprising:

depositing a second layer over said first layer subsequent to said first etch, said second layer deposited to a second thickness along said sidewall;

depositing a third layer over said second layer; and etching in a second etch said third layer, wherein said third layer is reduced by said second etch to a third thickness along said sidewall and wherein said second layer serves as a protective layer for said shallow trench during said second etch.

3. The method of claim 2 wherein said second thickness is unchanged by said second etch, and wherein said first, second and third layers in combination form a spacer along said sidewall, said spacer having a thickness corresponding to said first, second and third thicknesses.

4. The method of claim 2 wherein said second layer comprises TEOS (tetraethylorthosilicate).

5. The method of claim 2 wherein said third layer comprises nitride.

6. The method of claim 1 wherein said first layer comprises nitride.

7. The method of claim 1 wherein said shallow trench is substantially filled with material comprising high density plasma (HDP) oxide.

8. The method of claim 1 wherein said oxide layer is a residual oxide layer comprising a pre-implant oxide layer having a depth of approximately 125 Å and an oxide layer grown by a gate anti-reflective coating (GARC) anneal to a depth of approximately 95 Å.

9. The method of claim 1 wherein said depth of said oxide layer is between approximately 150 and 180 Angstroms.

10. The method of claim 1 wherein said semiconductor device comprises an isolation device.

11. A method of fabricating a semiconductor device, said method comprising:

receiving a substrate comprising a stacked gate and a shallow trench adjacent to said stacked gate, said substrate further comprising an oxide layer disposed over said stacked gate and said shallow trench and a first layer disposed over said oxide layer; and etching in a first etch said first layer, said first layer reduced by said first etch to a first thickness along said sidewall from said first etch;

wherein said oxide layer has a depth sufficient to withstand said first etch such that said oxide layer serves as a protective layer for said shallow trench during said first etch, said oxide layer serving as said protective layer in lieu of a liner layer.

12. The method of claim 11 comprising:

depositing a second layer over said first layer subsequent to said first etch, said second layer deposited to a second thickness along said sidewall;

depositing a third layer over said second layer; and etching in a second etch said third layer, wherein said third layer is reduced by said second etch to a third thickness along said sidewall and wherein said second layer serves as a protective layer for said shallow trench during said second etch.

13. The method of claim 12 wherein said second thickness is unchanged by said second etch, and wherein said first, second and third layers in combination form a spacer having a thickness corresponding to said first, second and third thicknesses.

14. The method of claim 12 wherein said second layer comprises TEOS (tetraethylorthosilicate).

15. The method of claim 12 wherein said third layer comprises nitride.

16. The method of claim 11 wherein said first layer comprises nitride.

17. The method of claim 11 wherein said shallow trench is substantially filled with material comprising high density plasma (HDP) oxide.

18. The method of claim 11 wherein said oxide layer is a residual oxide layer comprising a pre-implant oxide layer having a depth of approximately 125 Å and an oxide layer grown by a gate anti-reflective coating (GARC) anneal to a depth of approximately 95 Å.

19. The method of claim 11 wherein said depth of said oxide layer is between approximately 150 and 180 Angstroms.

20. The method of claim 11 wherein said semiconductor device comprises an isolation device.

* * * * *